United States Patent
Haddad et al.

(10) Patent No.: US 10,089,079 B2
(45) Date of Patent: Oct. 2, 2018

(54) RANDOM NUMBER GENERATOR

(71) Applicant: STMicroelectronics (Rousset) SAS, Rousset (FR)

(72) Inventors: Patrick Haddad, Saint-Etienne (FR); Viktor Fischer, Saint-Etienne (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 154 days.

(21) Appl. No.: 14/750,300

(22) Filed: Jun. 25, 2015

(65) Prior Publication Data
US 2016/0004510 A1  Jan. 7, 2016

(30) Foreign Application Priority Data

Jul. 2, 2014 (FR) .................................. 14 56298

(51) Int. Cl.
  *G06F 7/58* (2006.01)
  *H03K 3/84* (2006.01)
(52) U.S. Cl.
  CPC ............... *G06F 7/588* (2013.01); *H03K 3/84* (2013.01)
(58) Field of Classification Search
  CPC .................................. G06F 7/58; G06F 7/588
  USPC .................................. 708/250–251, 253–256
  See application file for complete search history.

(56) References Cited

U.S. PATENT DOCUMENTS

| 7,356,552 | B2   | 4/2008  | Hars    |              |
|-----------|------|---------|---------|--------------|
| 7,702,705 | B2 * | 4/2010  | Suzuki  | H03K 3/0315  |
|           |      |         |         | 708/250      |
| 8,410,857 | B2 * | 4/2013  | Dichtl  | G06F 7/588   |
|           |      |         |         | 331/57       |
| 8,583,711 | B2 * | 11/2013 | Hars    | G06F 7/588   |
|           |      |         |         | 331/57       |
| 9,405,510 | B2 * | 8/2016  | Karpinskyy | G06F 7/588 |
| 2005/0004961 | A1 | 1/2005  | Hars    |              |
| 2009/0172055 | A1* | 7/2009  | Radja   | G06F 7/588   |
|           |      |         |         | 708/251      |
| 2009/0222502 | A1* | 9/2009  | Ikegami | G06F 7/588   |
|           |      |         |         | 708/251      |
| 2012/0233232 | A1* | 9/2012  | Vergnes | G06F 7/584   |
|           |      |         |         | 708/251      |
| 2014/0351305 | A1* | 11/2014 | Hamilton | G06F 7/588  |
|           |      |         |         | 708/251      |

FOREIGN PATENT DOCUMENTS

WO     01/67231 A2    9/2001

OTHER PUBLICATIONS

French Search Report dated Apr. 22, 2015, for corresponding FR Application No. 1456298, 7 pages.
Kokubo et al., "Evaluation of ASIC Implementation of Physical Random Number Generators Using RS Latches," in Francillon et al. (eds.), *CARDIS 2013, LNCS 8419*, Springer International Publishing Switzerland, 2014, 14 pages.

(Continued)

*Primary Examiner* — Michael D. Yaary
(74) *Attorney, Agent, or Firm* — Seed IP Law Group LLP

(57) ABSTRACT

An integrated random signal generation circuit includes two logic gates, the output of each gate coupled to a respective first input of the other gate via assemblies of delay elements. The respective delays introduced by the assemblies of delay elements are adjustable.

14 Claims, 3 Drawing Sheets

(56) References Cited

OTHER PUBLICATIONS

Ben-Romdhane et al., "Design Methodology of an ASIC TRNG based on an open-loop delay chain," $11^{th}$ IEEE International New Circuits and Systems Conference (NEWCAS), Paris, France, Jun. 16-19, 2013, 4 pages.
Danger et al., "Fast True Random Generator in FPGAs," 2007 IEEE Northeast Workshop on Circuits and Systems, Montreal, Canada, Aug. 5-8, 2007, 4 pages.
Danger et al., "High speed true random number generator based on open loop structures in FPGAs," *Microelectronics Journal* 40:1650-1656, 2009.
Varchola et al., "New High Entropy Element for FPGA Based True Random Number Generators," Proceedings of the $12^{th}$ International Workshop on Cryptographic Hardware and Embedded Systems, CHES 2010, pp. 351-365.

* cited by examiner

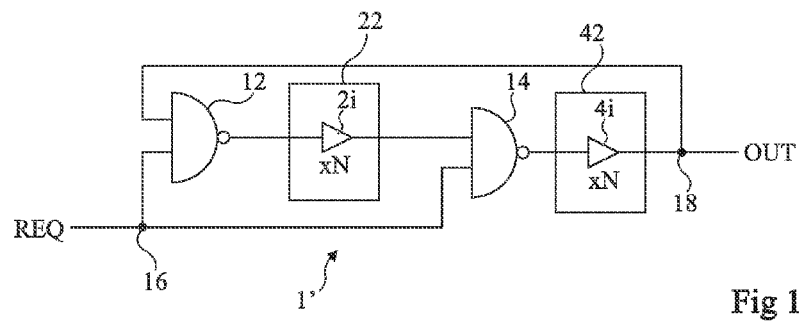
Fig 1
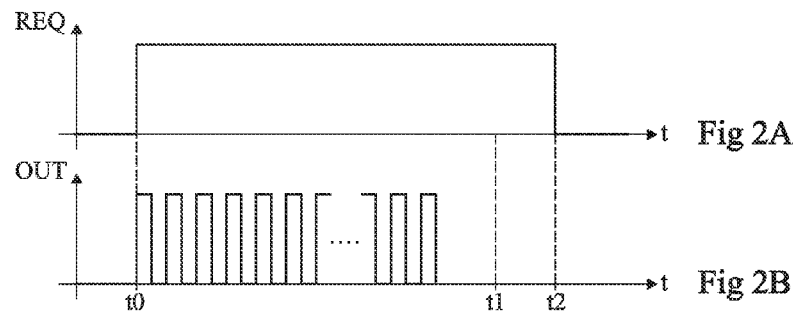
Fig 2A
Fig 2B
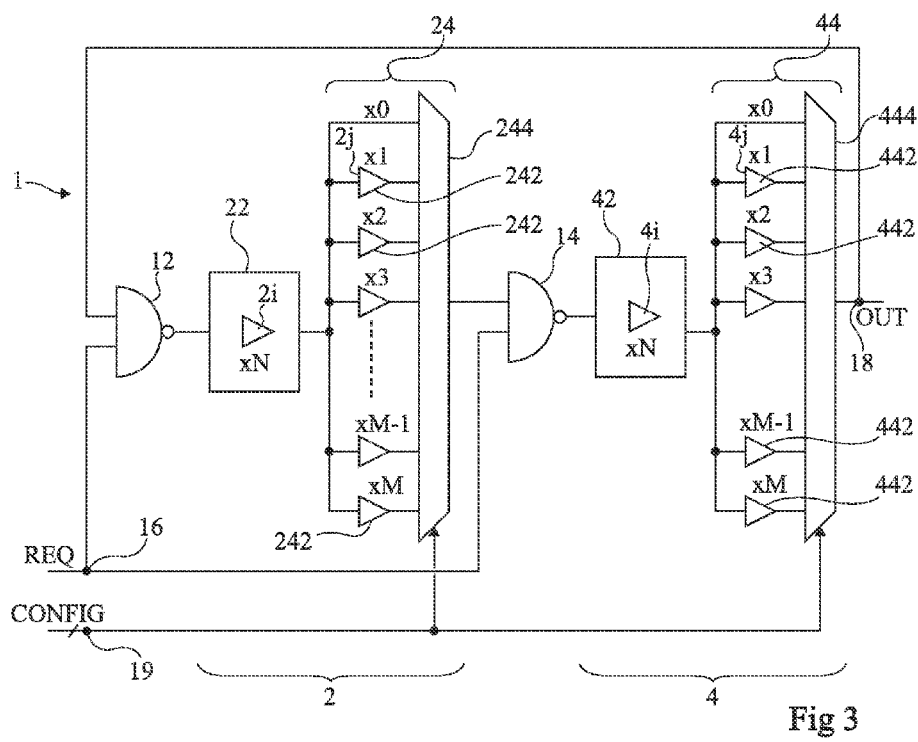
Fig 3

RANDOM NUMBER GENERATOR

CROSS-REFERENCE TO RELATED APPLICATION

This application claims the priority benefit of French Patent application number 1456298, filed on Jul. 2, 2014, the content of which is hereby incorporated by reference in its entirety.

BACKGROUND

Technical Field

The present disclosure generally relates to electronic circuits and, more specifically, to integrated circuits generating non-deterministic random numbers, commonly called "truly random".

Description of the Related Art

In many electronic circuits, so-called random number generators are used. Actually, such generators generate unpredictable binary numbers, the randomness of the generated numbers being only statistical.

There exist many methods for verifying the randomness of a number generated by an electronic circuit. Such methods comprise among others performing a plurality of draws or generations of random numbers and statistically verifying the uniformity of the distribution of the generated bits. For example, for a number over one bit, the proportions of generated 1s and 0s should among others be close to each other.

For certain applications, particularly cryptographic applications, the non-deterministic character of the generated numbers or randomness is important.

A known method comprises using metastable oscillations which appear in a ring formed of an even number of logic inverting gates. This phenomenon occurs when gates of the ring are forced to certain values and are then released. The electronic noise phenomena impacting the delay of each of these logic gates result in a random variation over time of the number of oscillations before stabilization thereof. Although, theoretically, such a solution is attractive, an issue lies, on manufacturing of circuits in large series, in the guarantee of the randomness of the generated numbers. Indeed, a poor imbalance of the delay elements prevents the circuit from generating unpredictable numbers. Further, such an imbalance cannot be well controlled during the design and the manufacturing of circuits.

BRIEF SUMMARY

An embodiment overcomes all or part of the disadvantages of usual random number generators, based on the metastability of oscillations.

Another embodiment provides a parameterizable random number generator.

Thus, an embodiment provides an integrated random signal generation circuit comprising two logic gates having their respective outputs connected to a first input of the other gate via assemblies of delay elements, wherein the respective delays introduced by the assemblies of delay elements are adjustable.

According to an embodiment, each assembly of delay elements comprises a first sub-assembly introducing a non-adjustable delay and a second sub-assembly introducing an adjustable delay.

According to an embodiment, the second sub-assemblies each comprise a plurality of series-connected delay elements, the adjustment being performed with the number of delay elements used to convey the signals.

According to an embodiment, the second sub-assemblies each comprise groups of delay elements connected in parallel, each group having a delay different from another group of the same sub-assembly, the adjustment of the introduced delay being obtained by the selection of the group conveying the signal.

According to an embodiment, a first multiplexer and a second multiplexer are interposed between the respective outputs of the second sub-assemblies of delay elements and the first respective inputs of the logic gates.

According to an embodiment, the second respective inputs of the logic gates receive a control signal triggering the generation of the random signal.

An embodiment provides a random number generation circuit, comprising:

an integrated circuit such as hereabove; and a digitizing circuit receiving the output of one of the assemblies of delay elements.

According to an embodiment, the digitizing circuit comprises:

an asynchronous counter having an input connected to the output of one of the assemblies of delay elements; and a circuit for sampling the counter output.

According to an embodiment, the counter comprises a number of first D-type flip-flops corresponding to the number of random state bits provided per generation period.

According to an embodiment, the sampling circuit is controlled by the control signal triggering the random signal generation.

According to an embodiment, the circuit comprises at least one circuit such as hereabove.

The foregoing and other features and advantages will be discussed in detail in the following non-limiting description of specific embodiments in connection with the accompanying drawings.

BRIEF DESCRIPTION OF THE SEVERAL VIEWS OF THE DRAWINGS

FIG. 1 shows the equivalent electric diagram of an exemplary random number generator based on the metastability of the oscillations in a ring formed of an even number of inverting logic gates;

FIGS. 2A and 2B illustrate, in the form of timing diagrams, the operation of the generator of FIG. 1;

FIG. 3 shows an embodiment of a configurable random number generator;

DETAILED DESCRIPTION

Figure 4:
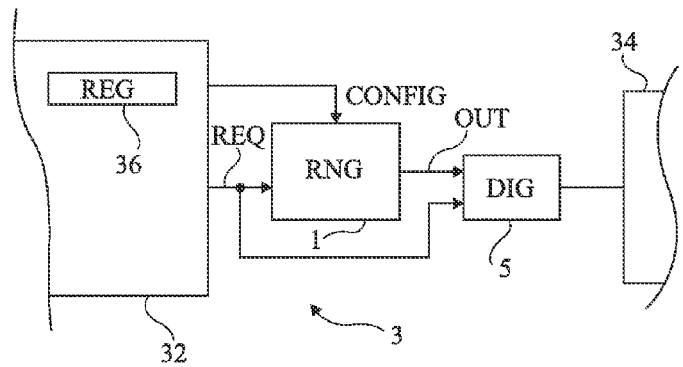
FIG. 4 very schematically illustrates in the form of blocks an example of an electronic circuit integrating a random number generator.

The same elements have been designated with the same reference numerals in the different drawings. For clarity, only those acts and elements which are useful to the understanding of the described embodiments have been shown and will be detailed. In particular, what exploitation is made of the generated numbers has not been detailed, the described embodiments being compatible with usual applications using random numbers. Further, the generation of control signals applied to the random number generation has not been detailed either, the described embodiments being here again compatible with usual digital electronic circuits.

In the following description, when reference is made to terms "about", "approximately", or "in the order of", this means to within 10%, preferably to within 5%.

FIG. 1 is a simplified representation of a random generator 1' in the form of an integrated circuit.

Such a generator 1' is based on the use of two logic inverting gates (for example, NAND) 12 and 14 looped back on each other with delay assemblies 22 and 42 interposed therebetween. The delay assemblies will for example be each formed of a plurality of delay elements $2_i$ or $4_i$ (with i ranging from 1 to N). Each delay element for example is a logic inverter. Each assembly 22, 42 introduces a delay, respectively τA', τB', in the signal propagation between logic gates 12 and 14. In the example of FIG. 1, the respective outputs of gates 12 and 14 are connected to the respective inputs of assemblies 22 and 42, having their outputs connected to a first input of the other gate (respectively 14 and 12). The second inputs of gates 12 and 14 are connected to an input terminal 16 of generator 1' intended to receive a random signal generation request signal REQ. An output terminal 18 of generator 1' is connected to the output of one of the delay assemblies (in the shown example, to the output of assembly 42) and delivers a random number pulse train OUT. The output may indifferently be sampled from the output of assembly 22.

FIGS. 2A and 2B illustrate the operation of generator 1' of FIG. 1. FIG. 2A illustrates an example of generation of trigger signal REQ. FIG. 2B illustrates an example of an output signal OUT.

Signal REQ is a request signal, inactive in the low state, and which, to cause the generation of a bit, comprises a pulse having its duration selected so that its falling edge occurs while output pulse train OUT is over, that is, when the oscillations have stopped and the reading of the state present at the output has been performed. For example, at a time t0, a falling edge is caused on signal REQ. This rising edge is sent onto the second respective input of gates 12 and 14. The edge on signal REQ then causes an oscillation phenomenon observable on signal OUT. The presence of assemblies 22 and 42 having different delays desynchronizes the outputs of gates 12 and 14 from each other, which makes the oscillations stop. The number of oscillations before the circuit stabilizes, that is, before the oscillations stop, depends on the internal noise of the transistors of the structure forming the delay elements 14 and 12. Between times $t_0$ and $t_1$, a counting and digitizing circuit (not shown in FIG. 1) counts and stores the number of cycles (e.g., the number of rising edges or the number of falling edges) of output signal OUT. At a time $t_2$, preferably subsequent or concurrent to end-of-count time $t_1$, signal REQ is taken back to the inactive state. More generally, state $t_2$ should be subsequent to time $t_1$ minus time τB', to guarantee that the reading is carried out before the state of terminal 18 switches by propagation of a state switching of gate 14 under the effect of the falling edge of signal REQ.

The number of cycles of the oscillating signal is a function of the difference between propagation delays τA' and τB' introduced by delay assemblies 22 and 42 and has a random character.

For the generator to be considered as random, the absolute value of the difference between delays τA' and τB' should be between respectively high and low limiting values. Such limiting values surround a range of values where the number of generated cycles has a random character. Indeed, if the difference between delays is too low, the oscillations never stop or stop after a time exceeding $t_2-t_0$ and the measured number of cycles then is not random at all. If, conversely, the oscillations stop too quickly (difference τA'–τB' too high in absolute value), the random character is not sufficient.

The practical implementation of the constraints discussed hereabove is an issue in that the difference between delays τA'–τB' varies from one circuit to the other. Indeed, this difference being due to the parameters of the transistors forming the inverting gates of the circuit and delay elements 22 and 42, it depends on technological manufacturing dispersions.

Further, it can be ascertained, on generation of signal REQ, to define a duration between its rising edges triggering the oscillations and it falling edges generally triggering the reading of the output signal ($t_1=t_2$) which is sufficient to guarantee the stopping of spontaneous oscillations in all cases, which is not always easy.

FIG. 3 very schematically shows an embodiment of a random number generator based on the metastability of oscillations.

It shows, as in FIG. 1, two NAND-type logic gates 12 and 14 having first respective inputs receiving a delayed signal originating from the other gate, respectively 14, 12. The output of gate 12 drives a first assembly 2 of delay elements. The output of second gate 14 drives a second assembly 4 of delay elements.

According to this embodiment, each assembly 2, 4 comprises a first sub-assembly or first series of N delay elements $2_i$, $4_i$, symbolized by a block 22, respectively 42. The output of the $n^{th}$ delay element $2_i$, $4_i$ of each sub-assembly 22, 42 is connected to the input of a second sub-assembly 24, respectively 44, configurable in terms of delay introduced on the signal. It can be considered that assemblies 22 and 42 of the generator of FIG. 1 become sub-assemblies 22 and 42 of assemblies 2 and 4 of generator 1 of FIG. 3.

In the example of FIG. 3, each sub-assembly 24, 44, comprises M groups of delay elements $2_i$, $4_i$, in parallel, each group of rank j (with j in the range from 1 to M) introducing a delay corresponding to j delay elements. The respective outputs of groups 242 and 442 are connected to M inputs of a multiplexer 244, respectively 444, M to 1. The output of multiplexer 244 is connected to the first input of gate 14. The output of multiplexer 444 is connected to the first input of gate 12 as well as to an output terminal 18 delivering oscillating signal OUT. In the example of FIG. 3, each multiplexer actually comprises M+1 inputs, its input of rank 0 directly receiving the output of sub-assembly 22, respectively 42. The respective selection inputs of multiplexers 244 and 444 are connected, according to the addressing mode (series or parallel), to one or a plurality of terminals 19 of application of configuration signals CONFIG enabling to select the chain or group 242, 442 of delay elements of respective sub-assemblies 24 and 44 to be included in the loop of generator 1. Assemblies 2 and 4 respectively introduce delays τA and τB which are configurable according to the number of delay elements $2_j$ included in the signal path.

FIG. 4 very schematically illustrates in the form of blocks an example of an electronic circuit 3 integrating a random number generator 1 (RNG) of the above-described type. Signals REQ and CONFIG originate from a processing unit 32. The temporarily oscillating random signal (output OUT of circuit 1) is applied to the input of a digitizing circuit 5 (DIG) having its output delivered to the function (block 34) using this random number. Signal REQ is applied to circuits 1 and 5. Digitizing circuit 5 may contain a synchronous counter or an asynchronous counter over a plurality of bits (in this last case, the number of bits of the counter should be sufficient to count all cycles) or a counter modulo 2 (for example, a T flip-flop). Blocks 32 and 34 may belong to the same circuit. Configuration signal(s) CONFIG are generated, for example, from a number stored in a register 36 (REG) having a size which is a function of the sum of the number of inputs of multiplexers 244 and 444.

The fact of making respective delays τA and τB introduced by delay lines 2 and 4 (FIG. 3) configurable enables to configure the random generator so that its operating range is in a range where the generator is considered as sufficiently random.

Such a configuration is achieved in an initial test phase of the product integrating the random generator and may be repeated along the product lifetime, for example, to take into account possible drifts of the parameters of the transistors.

Such a configuration is achieved, circuit after circuit. Once determined, the configuration is stored in one or a plurality of registers 36. According to an embodiment where the storage is only performed in volatile memory registers, the test phase should be repeated each time the circuit is started. This is why it will often be preferred to store this configuration in non-volatile fashion. According to whether this configuration is capable of being modified over the product lifetime or not, a reprogrammable non-volatile memory or a ROM will be used.

Figure 5:
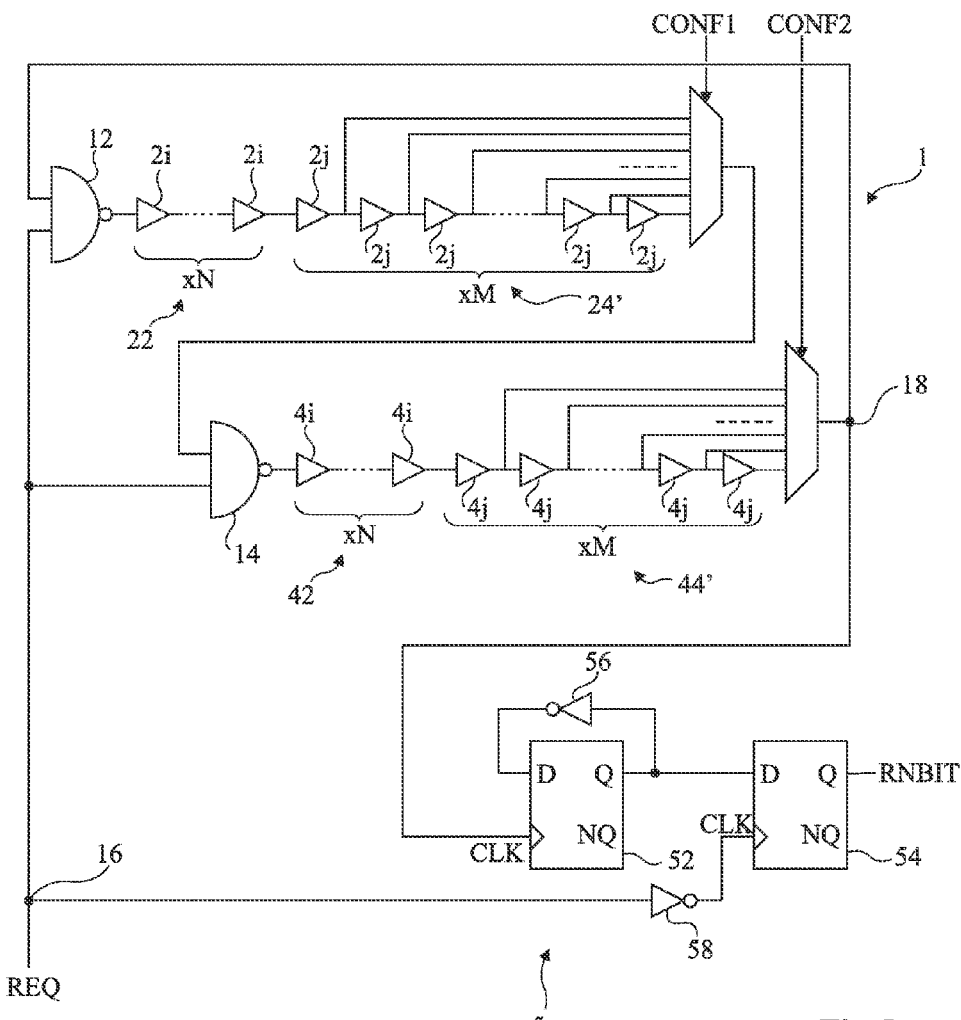
FIG. 5 shows another embodiment of a configurable random number generator.

FIG. 5 shows a simplified diagram of another embodiment of a random number generator 1.

As compared with the embodiment of FIG. 3, a difference lies in the association of the configurable delay elements. As previously, one or a plurality of delay elements form first sub-assemblies 22, 42. However, the configurable sub-assemblies, here 24' and 44', are made in the form of m delay elements $2_j$, $4_j$, in series between the output of respective sub-assemblies 22 and 42 and a $j^{th}$ input of multiplexers 244 and 444. The M inputs of multiplexers 244 and 444 are respectively connected to the M outputs of delay elements $2_j$ or $4_j$ (j being in the range from 1 to M). Thus, the selection of the multiplexer input to be applied to the input of logic gate 12, respectively 14, conditions the number of delay elements $2_j$ or $4_j$ used in the series association, and thus the delay τA, respectively τB, introduced. FIG. 5 assumes two configuration signals CONFIG. 1 and CONFIG. 2, respectively intended for multiplexers or selectors 244 and 444.

FIG. 5 also illustrates an example of circuit 5 for digitizing the output of generator 1. According to this example, circuit 5 comprises two D flip-flops 52 and 54. The direct or non-inverted Q output of flip-flop 52 is connected by an inverter 56 to the D input of flip-flop 52. As a variation, the inverted NQ output of the flip-flop is used. The direct Q output is further connected to the D input of flip-flop 54. The direct Q output of flip-flop 54 delivers, on each falling edge of signal REQ, a bit having a random state. As a variation, the inverse NQ output of flip-flop 54 may be used.

Assuming D flip-flops active on the rising edges of their clock signals, triggering input CLK of flip-flop 52 is connected to output terminal 18 of generator 1 and the triggering input of flip-flop 54 receives the inverse of signal REQ. In FIG. 5, this has been symbolized by an inverter 58 connecting terminal 16 to input CLK of flip-flop 54.

The digitizing circuit operates as follows. The state of flip-flop 52 corresponds to the state of the least significant bit of the number of oscillations generated by circuit 1. Flip-flop 52 plays the role of an asynchronous counter over 1 bit. Flip-flop 54 samples the output of first flip-flop 52, and thus of the counter, when request signal REQ switches back down, that is, at the end of the random bit generation interval.

Figure 6:
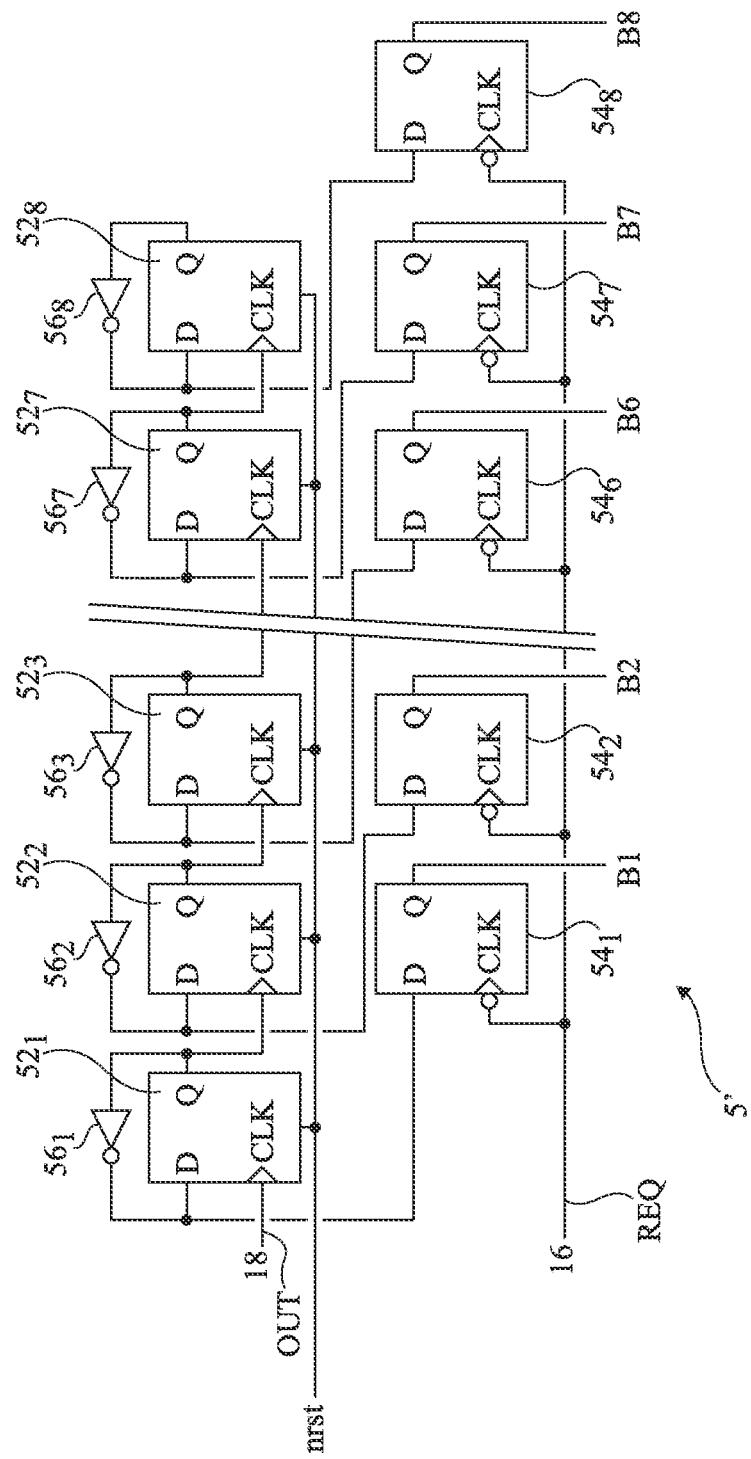
FIG. 6 shows a variation of a circuit for digitizing a random number generator.

FIG. 6 shows another embodiment where generator 1 is used to generate, on each pulse of signal REQ, a random number over eight bits.

Generator 1 may be that of the embodiment of FIG. 3 or that of the embodiment of FIG. 5.

Digitizing circuit 5' here comprises an asynchronous eight-bit counter having its outputs sampled by signal REQ. Thus, eight D flip-flops $52_1$ to $52_8$ ($52_k$, with k in the range from 1 to 8) are series-assembled, the direct Q output of a flip-flop of rank k being looped back, by an inverter $56_k$, onto its own D data input as well as, except for last flip-flop $52_8$, onto triggering input CLK of the flip-flop of next rank. The triggering input of first flip-flop $52_1$ is connected to output 18 of generator 1. Further, the data input of each flip-flop $52_k$ is connected to the D data input of a flip-flop $54_k$ of same rank k. The direct Q (or inverse NQ) outputs of eight flip-flops $54_1$ to $54_8$ each provide a random bit state on each falling edge of signal REQ. The inverted triggering inputs of flip-flops $54_1$ to $54_8$ are connected together to input terminal 16 of generator 1. Flip-flops $52_1$ to $52_8$ are reset via their reset inputs connected to a terminal nrst. This resetting occurs after time $t_2$.

More generally, the output of generator 1 may be associated with an asynchronous or synchronous counter over any number of bits. The synchronous and asynchronous counters differ by the signals triggering the flip-flops. Unlike the architecture of an asynchronous counter, the flip-flops of a synchronous counter used in the framework of circuit 5 are all connected to output terminal 18 of the generator.

Since the flip-flops of a synchronous counter are rated by the same signal, the period between times $t_1$ and $t_2$ may be shorter than that of the case of an asynchronous counter.

The upper operating frequency of a synchronous counter is generally smaller than that of an asynchronous counter. Accordingly, the selection of this second type of counter is relevant when the frequency of the oscillations is high.

An advantage of the above-described embodiments is that it is now possible to adjust the randomness of the generator to compensate for possible manufacturing dispersions.

Another advantage is that the time interval between the rising and falling edges of the request signal may be more accurately determined. Indeed, from the time when the delay introduced by the delay elements is configured, the necessary time interval may be more accurately determined before being sure that the oscillations stop and, accordingly, the duration of the pulses of the request signal may be adjusted.

Various embodiments have been described. Various variations, modifications, and improvements will occur to those skilled in the art. In particular, the number of delay elements $2_j$ and $4_j$ of configurable sub-assemblies 24 and 44 may vary. As a specific example, a number in the range from some ten to some thousand delay elements $2_j$ and $4_j$, and preferably in the order of 128 or 256 delay elements, may be provided. A number representing a power of 2 is preferable since this eases the forming of the multiplexers and the generation of the respective configuration signals. Similarly, the number of delay elements $2_i$ and $4_i$ of fixed sub-assemblies 22 and 24 may vary. The NAND gates used in generator 1 may be NAND gates, or combinations of NOR, XOR, OR, AND, and NOT gates.

Further, the practical implementation of the embodiments which have been described is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An integrated random signal generation circuit comprising:
    a plurality of delay element assemblies, each delay element assembly having an adjustable delay;
    a first logic gate having a first input, a second input, and an output;
    a second logic gate having a first input, a second input, and an output, the output of the first logic gate coupled through at least one first delay element assembly of the plurality of delay element assemblies to the first input of the second logic gate, the output of the second logic gate coupled through at least one second delay element assembly of the plurality of delay element assemblies to the first input of the first logic gate, wherein each delay element assembly includes:
        a first sub-assembly configured to provide a non-adjustable delay; and
        a second sub-assembly configured to provide an adjustable delay.

2. The integrated random signal generation circuit of claim 1, wherein each second sub-assembly comprises:
    a plurality of groups of series-connected delay elements, each one of the groups of series-connected delay elements having a different number of delay elements coupled in series.

3. The integrated random signal generation circuit of claim 1, wherein each second sub-assembly comprises:
    a plurality of series-connected delay elements, each one of the plurality of series-connected delay elements coupled in parallel with the other ones of the plurality of series-connected delay elements, the adjustable delay provided by selecting one of the groups plurality of series-connected delay elements, wherein each one of the plurality of series-connected delay elements includes at least two delay elements coupled in series.

4. The integrated random signal generation circuit of claim 1, comprising:
    a first multiplexer interposed between an output of the at least one first delay element assembly and the first input of the second logic gate; and
    a second multiplexer interposed between an output of the second at least one delay element and the first input of the first logic gate.

5. The integrated random signal generation circuit of claim 1, wherein the second respective inputs of the first and second logic gates are configured to receive a control signal, the control signal configured to initiate generation of an integrated random signal.

6. A random number generation circuit, comprising:
    a first logic gate;
    a second logic gate;
    a first adjustable delay element assembly coupled in series between an output of the first logic gate and an input of the second logic gate;
    a second adjustable delay element assembly coupled in series between an output of the second logic gate and an input of the first logic gate; and
    a digitizing circuit coupled to an output of the second adjustable delay element, wherein the first and second adjustable delay element assemblies each include a first sub-assembly configured to provide a fixed delay and a second sub-assembly configured to provide a selectable delay.

7. The random number generation circuit of claim 6, wherein each adjustable delay element assembly comprises:
    a first sub-assembly configured to provide a fixed delay; and
    a second sub-assembly configured to provide a selectable delay.

8. The random number generation circuit of claim 7, wherein the second sub-assembly comprises:
    at least two delay element circuits, a first one of the delay element circuits having a first number of delay elements connected in series, and a second one of the delay element circuits having a second number of delay elements connected in series, the first number being different from the second number.

9. The random number generation circuit of claim 8, wherein the at least two delay element circuits are coupled in parallel to each other.

10. The random number generation circuit of claim 9, wherein the second sub-assembly comprises:
    a multiplexer, each of the at least two delay element circuits providing an input to the multiplexer, an output of the multiplexer providing an output of the second sub-assembly.

11. A method of generating a random number, comprising:
    passing a first signal from a first logic gate into a first adjustable delay element assembly, the first adjustable delay element having a first sub-assembly circuit configured to provide a first non-adjustable delay and a second sub-assembly configured to provide a first adjustable delay;
    passing a second signal from the first adjustable delay element assembly into a second logic gate;
    passing a third signal from the second logic gate into a second adjustable delay element assembly, the second adjustable delay element assembly having a third sub-assembly configured to provide a second fixed delay and a fourth sub-assembly configured to provide a second selectable delay;
    passing a fourth signal from the second adjustable delay element assembly into the first logic gate;
    passing the fourth signal into a digitizing circuit; and
    producing the random number with the digitizing circuit.

12. The method of generating the random number of claim 11, comprising:
    producing the second signal from the first signal by delaying the first signal, the first signal delayed with the first sub-assembly circuit that provides the first non-adjustable delay and the first signal further delayed with the second sub-assembly that provides the first adjustable delay.

13. The method of generating the random number of claim 12, wherein producing the second signal from the first signal comprises:

passing the further delayed first signal through one of a plurality of groups of series-connected delay elements, each one of the groups of series-connected delay elements having a different number of delay elements coupled in series.

14. The method of generating the random number of claim 13, wherein passing the further delayed first signal through one of the plurality of groups of series-connected delay elements comprises:

selecting one of the plurality of groups of series-connected delay elements with a control signal, the control signal applied to a multiplexer.

* * * * *